(12) United States Patent
Zhang

(10) Patent No.: US 10,045,441 B2
(45) Date of Patent: Aug. 7, 2018

(54) TOUCH PANEL AND ITS MANUFACTURING METHOD

(71) Applicant: BOE TECHNOLOGY GROUP CO., LTD., Beijing (CN)

(72) Inventor: Fangzhen Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 498 days.

(21) Appl. No.: 14/415,694

(22) PCT Filed: Apr. 22, 2014

(86) PCT No.: PCT/CN2014/075904
§ 371 (c)(1),
(2) Date: Jan. 19, 2015

(87) PCT Pub. No.: WO2015/089967
PCT Pub. Date: Jun. 25, 2015

(65) Prior Publication Data
US 2015/0366068 A1    Dec. 17, 2015

(30) Foreign Application Priority Data

Dec. 19, 2013  (CN) .......................... 2013 1 0705569

(51) Int. Cl.
*H05K 3/00* (2006.01)
*H05K 1/02* (2006.01)
(Continued)

(52) U.S. Cl.
CPC ........... *H05K 3/0017* (2013.01); *G06F 3/044* (2013.01); *H05K 1/0274* (2013.01);
(Continued)

(58) Field of Classification Search
CPC ........... G06F 3/044; G06F 2203/04103; G06F 2203/04111; H05K 1/0274; H05K 1/0284;
(Continued)

(56) References Cited

U.S. PATENT DOCUMENTS

2010/0233930 A1* 9/2010 Ishida .................... G06F 3/044
445/24
2011/0279390 A1  11/2011 Park et al.
(Continued)

FOREIGN PATENT DOCUMENTS

CN       102929420 A    2/2013
CN       102955624 A    3/2013
(Continued)

OTHER PUBLICATIONS

First Office Action regarding Chinese application No. 201310705569.3, dated Feb. 2, 2016. Translation provided by Dragon Intellectual Property Law Firm.
(Continued)

*Primary Examiner* — A. Dexter Tugbang
(74) *Attorney, Agent, or Firm* — Harness, Dickey & Pierce, P.L.C.

(57) ABSTRACT

A touch panel and its manufacturing method are provided. In the touch panel, a transparent conductive layer is partitioned by a height difference structure into first electrodes, an array of second electrode components and filling blocks. The array of second electrode components is connected serially by an array of conductive bridging lines so as to form several columns of second electrodes.

20 Claims, 3 Drawing Sheets

(51) Int. Cl.
*G06F 3/044* (2006.01)
*H05K 3/46* (2006.01)
*H05K 1/16* (2006.01)

(52) U.S. Cl.
CPC .......... *H05K 1/0284* (2013.01); *H05K 3/0023* (2013.01); *H05K 3/4644* (2013.01); *G06F 2203/04103* (2013.01); *G06F 2203/04111* (2013.01); *H05K 1/162* (2013.01); *H05K 2201/0108* (2013.01); *H05K 2201/0195* (2013.01); *H05K 2201/0326* (2013.01); *H05K 2201/10128* (2013.01); *Y10T 29/49147* (2015.01); *Y10T 29/49155* (2015.01); *Y10T 29/49158* (2015.01)

(58) Field of Classification Search
CPC .... H05K 1/162; H05K 3/0017; H05K 3/0023; H05K 3/4644; H05K 2201/0108; H05K 2201/0195; H05K 2201/0326; H05K 2201/10128; Y10T 29/49147; Y10T 29/49155; Y10T 29/49158
See application file for complete search history.

(56) References Cited

U.S. PATENT DOCUMENTS

2012/0081333 A1* 4/2012 Ozeki .................... G06F 3/044
345/174
2012/0182230 A1* 7/2012 Wang .................... G06F 3/044
345/173

FOREIGN PATENT DOCUMENTS

| CN | 202887131 U | 4/2013 |
|---|---|---|
| CN | 103699261 A | 4/2014 |
| EP | 2354908 A1 | 8/2011 |
| JP | 2008227149 A * | 9/2008 |

OTHER PUBLICATIONS

Written Opinion of the International Searching Authority for international application No. PCT/CN2014/075904.

* cited by examiner

TOUCH PANEL AND ITS MANUFACTURING METHOD

CROSS-REFERENCE TO RELATED APPLICATION

The present application is the U.S. national phase of PCT Application No. PCT/CN2014/075904 filed on Apr. 22, 2014, which claims priority to the Chinese application No. 201310705569.3 filed on Dec. 19, 2013, the entire contents of which are incorporated herein by reference.

TECHNICAL FIELD

The present disclosure relates to the field of touch technology, in particular to a touch panel and its manufacturing method.

BACKGROUND

Along with advances in technology, touch panel has been widely used in various electronic products due to its features such as direct use and user-friendly design. In order to improve its market competitiveness, it is a goal for the manufacturers to reduce the process steps and cost, and improve the performances thereof.

For a touch panel technology, a capacitance-type touch panel has such advantages as long service life, high transmittance and support to multi-touch, as compared with a resistance-type touch panel. In addition, the capacitance-type touch panel can also effectively suppress noise and ground parasitic capacitance. Hence, the capacitance-type touch panel has currently become one of the hot spots for the manufacture of the touch panel. As shown in FIG. 1, the touch panel 10' includes a plurality of row-distributed driving electrodes 11', a plurality of column-distributed sensing electrodes 12' and a plurality of detection units (not shown). The driving electrodes 11' and the sensing electrodes 12' are distributed in a crisscross manner, and detection capacitance matrices are formed at the junctions. A touch detection principle of the capacitance-type touch panel is that a touch scanning signal is applied to the driving electrodes in each row, and the detection unit detects output signals from the sensing electrodes corresponding to the driving electrodes in each row sequentially, so as to detect a change in the capacitance in the detection capacitance matrices, thereby to detect the touch and determine a touch position.

For the electronic product with the touch panel, it is required to select the transmittance of the materials of the driving electrode 11' and the sensing electrode 12' as 90%-95%, so as not to affect the image display. However, as shown in FIG. 2, when the driving electrodes 11' and the sensing electrodes 12' are formed in a crisscross manner, the transmittance and reflectance of respective portions of the entire touch panel will be different from each other, and as a result, uneven image display will occur.

SUMMARY

An object of the present disclosure is to provide a touch panel and its manufacturing method, so as to prevent the occurrence of uneven image display due to different transmittance and reflectance of the respective portions of the entire touch panel when driving electrodes and sensing electrodes are formed in a crisscross manner.

In one aspect, the present disclosure provides a touch panel, including:

a base substrate;

an insulating, height difference structure arranged on the base substrate; and a transparent conductive layer covering the entire base substrate and partitioned by the height difference structure into first electrodes, an array of second electrode components and filling blocks arranged between the first electrodes and the array of second electrode components, any adjacent two of the first electrodes, the array of second electrode components and the filling blocks being staggered from each other in a height direction due to their different heights relative to the base substrate, so that the adjacent two of the first electrodes, the array of second electrode components and the filling blocks are insulated from each other.

The array of second electrode components are connected serially by means of an array of conductive bridging lines so as to form several columns of second electrodes, and an extension direction of the respective second electrode is perpendicular to an extension direction of the first electrode.

In another aspect, the present disclosure provides a method for manufacturing a touch panel, including:

a step of preparing a base substrate;

a step of forming an array of conductive bridging lines on the base substrate;

a step of forming an insulating, height difference structure arranged on the base substrate and covering the array of bridging lines, the height difference structure being provided with an array of windows, two ends of the respective bridging line are exposed through the array of windows; and a step of forming a transparent conductive layer covering the entire base substrate, a portion of the transparent conductive layer, which falls within the array of windows, forming an array of second electrode components, and the other portions being partitioned by the height difference structure into first electrodes and filling blocks arranged between the first electrodes and the array of second electrode components, any adjacent two of the first electrodes, the array of second electrode components and the filling blocks being staggered from each other in a height direction due to their different heights relative to the base substrate, so that the adjacent two of the first electrodes, the array of second electrode components and the filling blocks are insulated from each other.

A connection line of the two exposed ends of the respective bridging line is in a direction perpendicular to an extension direction of the first electrode, and the respective second electrode component is lapped onto the corresponding end of the bridging line so that the array of second electrode components are connected serially by means of the bridging lines to form several columns of second electrodes. An extension direction of the respective second electrode is perpendicular to an extension direction of the first electrode.

The present disclosure has the following advantageous effects. According to the present disclosure, the transparent conductive layer is partitioned by the height difference structure into the first electrodes, the array of second electrode components and the filling blocks, and the array of second electrode components is connected serially by means of the array of conductive bridging lines to form several columns of second electrodes. Thus, a layout process for the transparent conductive layer will be omitted, and as a result, it is able to reduce the process steps and the production cost. In addition, the transparent conductive layer covers the entire base substrate, and as a result, it is able to improve the evenness of the transmittance and reflectance of the entire touch panel, thereby to improve the evenness of the image display.

BRIEF DESCRIPTION OF THE DRAWINGS

In order to illustrate the technical solutions of the present disclosure or the prior art in a clearer manner, the drawings desired for the present disclosure or the prior art will be described hereinafter briefly. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

Figure 1:
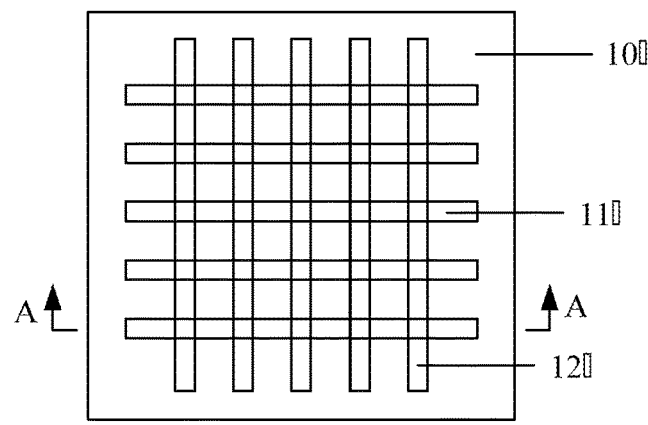
FIG. 1 is a schematic view showing an existing touch panel.
Figure 2:
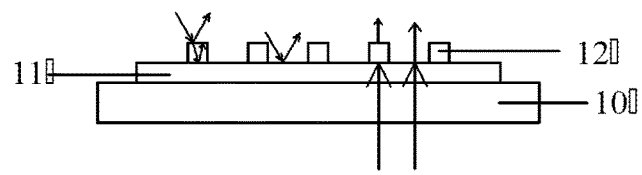
FIG. 2 is a sectional view along line A-A in FIG. 1.
Figure 3:
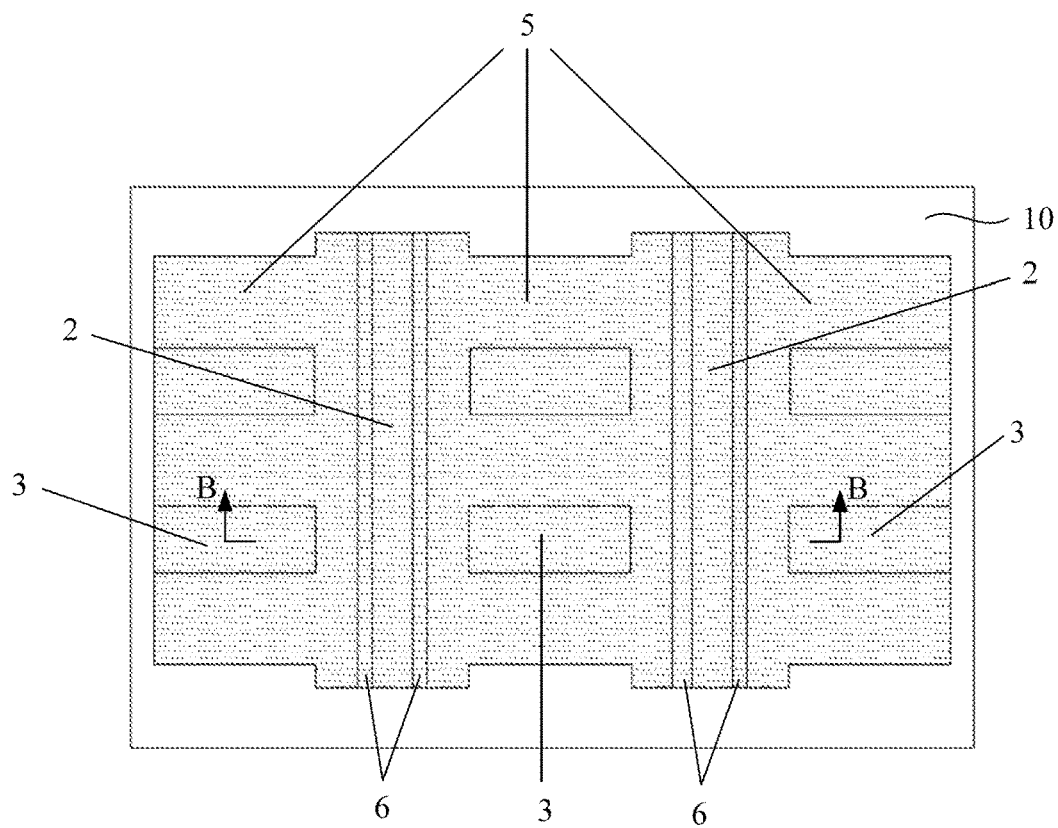
FIG. 3 is a schematic view showing a touch panel according to one embodiment of the present disclosure.
Figure 4:
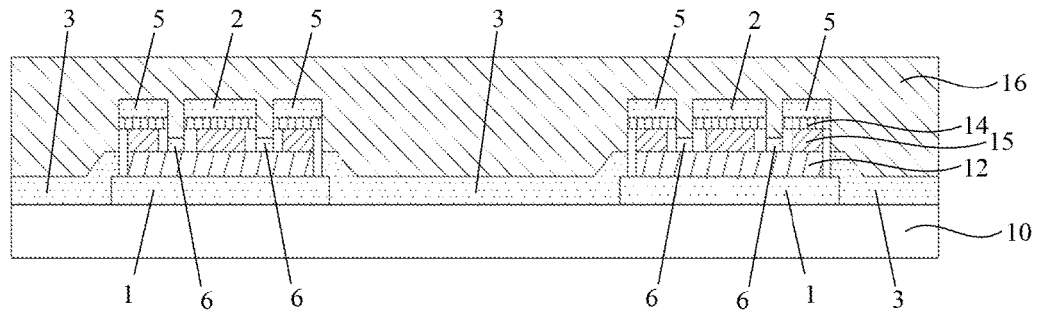
FIG. 4 is a sectional view along line B-B in FIG. 3.
Figure 5:
FIGS. 5-11 are schematic views showing the procedure for manufacturing the touch panel in FIG. 3.
Figure 6:
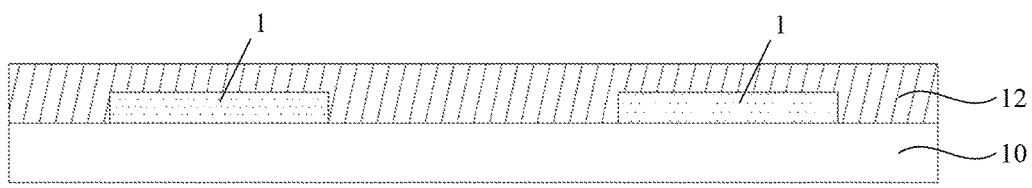
Figure 7:
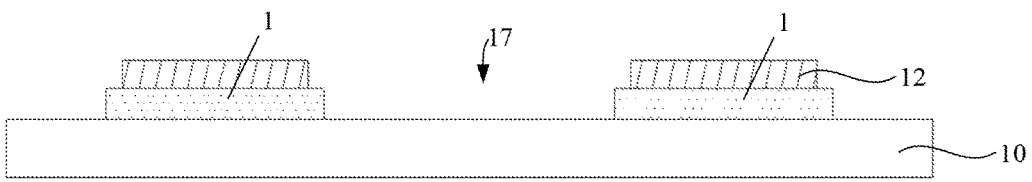
Figure 9:
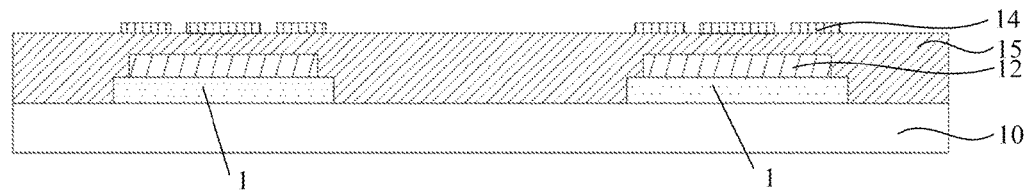
Figure 10:
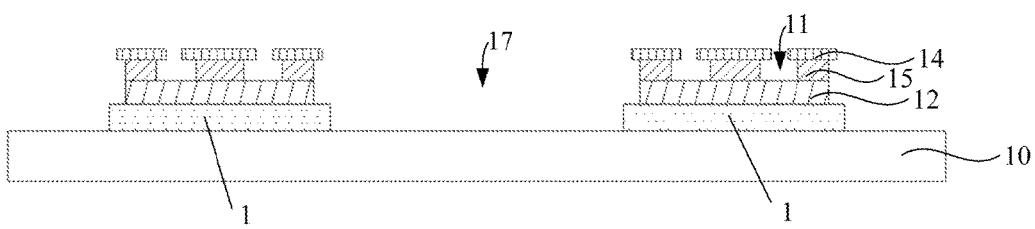
Figure 11:
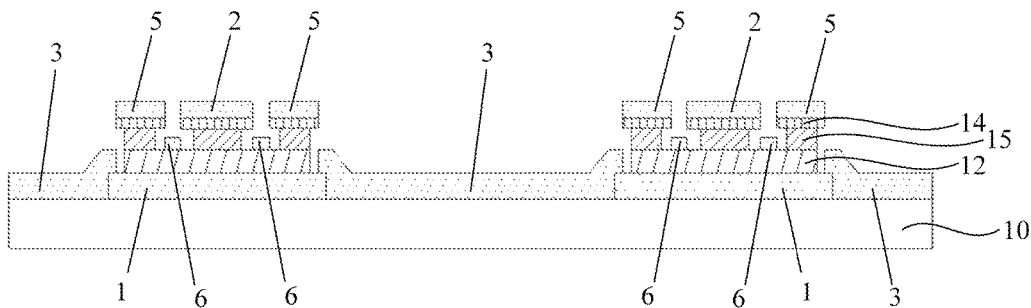

As shown in FIGS. 3-11, a touch panel of the present disclosure includes a base substrate 10, an array of conductive bridging lines 1, an insulating, height difference structure, and a transparent conductive layer (e.g., ITO or IZO). The array of bridging lines 1 are arranged on the base substrate 10, as shown in FIG. 5. The height difference structure is arranged on the base substrate 10 and covers the array of bridging lines 1. The height difference structure is further provided with an array of windows 17 through which two ends of the respective bridging line 1 are exposed, as shown in FIG. 7. The transparent conductive layer covers the entire base substrate 10, a portion of the transparent conductive layer, which falls within the array of windows 17, forms an array of second electrode components 3, and the other portion is partitioned by the height difference structure into first electrodes 2 and filling blocks 5, 6 arranged between the first electrodes 2 and the array of second electrode components 3. Any adjacent two of the first electrodes 2, the second electrode components 3 and the filling blocks 5, 6 are staggered from each other in a height direction due to their different heights relative to the base substrate 10, so that the adjacent two of the first electrodes 2, the second electrode components 3 and the filling blocks 5, 6 are insulated from each other, as shown in FIG. 11. A connection line of the exposed two ends of the respective bridging line 1 is in a direction perpendicular to an extension direction of the first electrode 2, and the respective second electrode component 3 is lapped onto the corresponding end of the bridging line 1, so that the array of the second electrode components 3 is connected serially by means of the bridging line 1 to form several columns of second electrodes. An extension direction of the second electrode is perpendicular to that of the first electrode 2. Hence, a detection capacitance matrix is formed at a junction between the first electrodes 2 and the second electrode, and as a result, it is able to detect the touch.

The first electrode 2 is a sensing electrode, while the second electrode is a driving electrode. The bridging line 1 is of a very small dimension, and usually its thickness and width are each less than 70 μm.

To be specific, the height difference structure includes a first insulating layer 12 and a second insulating layer 15 arranged above the first insulting layer 12. The first insulating layer 12 and the second insulating layer 15 are each made of an inorganic insulating material. The second insulating layer 15 is arranged within the range of the first insulating layer 12, and has an area less than an area of the first insulating layer 12, so as to expose a part of the first insulating layer 12, as shown in FIG. 10. The two insulating layers are provided so as to facilitate the formation of the desired height difference structure. Specifically, the insulating layer 12 is formed at first, and the array of windows 17 is formed within the first insulating layer 12 by etching, as shown in FIG. 7. Then, the second insulating layer 15 is formed above the first insulating layer 12, and the second insulating layer 15 is etched so as to enable the second insulating layer to be arranged within the range of the first insulating layer 12, and to be of the area less than the first insulating layer 12, thereby to expose the first insulating layer 12.

Further, a plurality of slots 11 are provided within the second insulating layer 15, and the portion of the transparent conductive layer, which falls within the slot 11, forms the filling block 6 adjacent to the first electrodes 2. The slot 11 is provided so as to enable a height of the first electrodes 2 relative to the base substrate 10 to be different from a height of the adjacent filling block 6 relative to the base substrate 10, thereby to stagger the first electrodes 2 and the adjacent filling block 6 from each other in a height direction. Meanwhile, the first electrodes 2 and the filling block 5 arranged at an identical height relative to the base substrate 10 are separated from each other by the slot 11.

In order to fully separate the first electrodes 2 from the adjacent filling block 6 by the slot 11, the touch panel in this embodiment further includes a photosensitive layer 14 arranged between the second insulating layer 15 and the transparent conductive layer forming the first electrodes 2, and sections of the second insulating layer 15 and the photosensitive layer 14 form a plurality of T-shaped structures with bigger top and smaller bottom.

In an alternative embodiment, the first insulating layer 12 and the second insulating layer 15 are made of silicon nitride, silicon oxide or silicon oxynitride, or a combination of two or more of them. The T-shaped structure with bigger top and smaller bottom is formed by the following steps.

Figure 8:
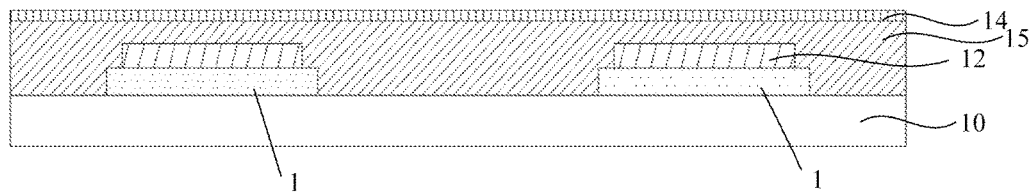

At first, the photosensitive layer 14, e.g., a transparent organic resin layer, is coated onto the second insulating layer 15, as shown in FIG. 8. Then, the photosensitive layer 14 is exposed and developed so as to form a photosensitive-layer unreserved region and a photosensitive-layer reserved region, as shown in FIG. 9. Finally, the second insulating layer 15 at the photosensitive-layer unreserved region is etched by a dry etching method, so as to form a plurality of slots 11 and expose the first insulating layer 12, thereby to provide different heights at a surface of the first insulating layer 12. During the dry etching, bottom over-etching will occur, which results in the T-shaped structures with bigger top and smaller bottom formed by the longitudinal sections of the second insulating layer 15 and the remaining photosensitive layer 14, as shown in FIG. 10. As a result, it is able to ensure different heights of the transparent conductive layer and to ensure the adjacent patterns to be fully separated from each other, as shown in FIG. 11.

In the above technical solution, the transparent conductive layer is partitioned by the height difference structure into the first electrodes, the array of second electrode components and the filling blocks, and the array of the second electrode components are connected serially by means of the array of conductive bridging lines to form several columns of second electrodes. Hence, a layout process for the transparent conductive layer will be omitted, and as a result, it is able to reduce the process steps and the production cost. Meanwhile, the transparent conductive layer covers the entire base substrate, it is able to improve the evenness of the transmittance and reflectance of the entire touch panel, thereby to improve the evenness of the image display. In addition, the bridging line 1 is of a very small dimension, so the array of bridging lines 1 will not adversely affect the evenness of the transmittance and reflectance of the touch panel.

Obviously, the above embodiment is merely provided so as to facilitate the understanding of the present disclosure, and a person skilled in the art may further make variations without departing from the principle of the present disclosure.

For example, in the above embodiment, between the first electrodes 2 and the array of second electrode components 3, the transparent conductive layer may be partitioned by the height difference structure into two parts, i.e., the filling block 5 and the filling block 6, and the filling block 6 is flush with the first electrodes 2. However, the present disclosure is not limited thereto. The filling blocks 5 and 6 may be formed integrally, and any adjacent two of the first electrodes 2, the array of the second electrode components 3 and the filling block may be staggered from each other in a height direction due to their different heights relative to the base substrate 10, so that the adjacent two of the first electrodes 2, the array of the second electrode components 3 and the filling block are insulated from each other.

In addition, in the above embodiment, the heights of the first electrodes 2, the array of the second electrode components 3 and the filling block relative to the base substrate 10 are configured to be that the first electrodes 2 are of a maximum height which is followed by the filling block, and the second electrode component 3 is of a minimum height. However, the present disclosure is not limited thereto. The second electrode component 3 may be of a maximum height which is followed by the filling block, and the first electrodes 2 may be of a maximum height. In this case, the second insulating layer 15 may be formed with a concave array, and the portion of the transparent conductive layer, which falls within the concave array, may form the array of second electrode components 3. Then, the array of the second electrode components 3 is connected serially by means of the array of conductive bridging lines 1 to form several columns of second electrodes. Alternatively, any other order in heights may also be coated.

Also, the touch panel may include a third insulating layer 16 which forms a top surface opposite to the base substrate 10 so as to provide insulation and protection effects, as shown FIG. 4.

During the actual application, it is desired to ensure the transmittance of each layer in the touch panel to be greater than 90%, preferably greater than 95%, so as not to affect the normal image display.

As shown in FIGS. 4-11, a method for manufacturing the touch panel of the present disclosure includes:

preparing the base substrate 10;

forming the array of conductive bridging lines 1 on the base substrate 10;

forming an insulating, height difference structure arranged on the base substrate 10 and covering the array of bridging lines 1, the height difference structure being provided with the array of windows 17 through which two ends of the respective bridging line 1 are exposed; and forming the transparent conductive layer covering the entire base substrate 10, a portion of the transparent conductive layer, which falls within the array of windows, forming the array of second electrode components 3, and the other portions being partitioned by the height difference structure into the first electrodes 2 and filled blocks 5, 6 arranged between the first electrodes 2 and the array of second electrode components 3, any adjacent two of the first electrodes 2, the array of second electrode components 3 and the filled blocks being staggered from each other in a height direction due to their different heights relative to the base substrate 10, so that the adjacent two of the first electrodes 2, the array of second electrode components 3 and the filled blocks 5, 6 are insulated from each other.

A connection line of the two exposed ends of the respective bridging line 1 is in a direction perpendicular to an extension direction of the first electrode 2, and the respective second electrode component 3 is lapped onto the corresponding end of the bridging line 1 so that the array of second electrode components 3 are connected serially to form several columns of second electrodes. An extension direction of the second electrode is perpendicular to that of the first electrode 2.

The first electrode 2 is a sensing electrode while the second electrode is a driving electrode.

As shown in FIGS. 6-10, the step of forming the height difference structure includes:

forming the first insulating layer 12, and forming the array of windows 17 in the first insulating layer 12 by an etching process, as shown in FIG. 7; and forming the second insulating layer 15 above the first insulating layer 12, and etching the second insulating layer 15 by an etching process, so as to enable the second insulating layer 15 to be arranged within the range of the first insulating layer 12 and have an area less than an area of the first insulating layer 12, thereby to expose the first insulating layer 12.

The first insulating layer 12 and the second insulating layer 15 are each made of an inorganic insulating material.

Further, in the step of etching the second insulating layer 15, a plurality of slots 11 are provided within the second insulating layer 15, and the portion of the transparent conductive layer, which falls within the slot 11, forms the filling block 6 adjacent to the first electrodes 2. The slot 11 is provided so as to enable a height of the first electrodes 2 relative to the base substrate 10 to be different from a height of the adjacent filling block 6 relative to the base substrate 10, thereby to stagger the first electrodes 2 and the adjacent filling block 6 from each other in a height direction. Meanwhile, the first electrodes 2 and the filling block 5 arranged at an identical height relative to the base substrate 10 are separated from each other by the slot 11.

Further, the step of etching the second insulating layer 15 further includes:

coating the photosensitive layer 14, e.g., a transparent organic resin layer, onto the second insulating layer 15, as shown in FIG. 8;

exposing and developing the photosensitive layer 14 so as to form the photosensitive-layer unreserved region and the photosensitive-layer reserved region, as shown in FIG. 9; and etching off the second insulating layer 15 at the photosensitive-layer unreserved region by a dry etching method, so as to form the plurality of slots 11 and expose the first insulating layer 12, thereby to provide different heights at a surface of the first insulating layer 12. During the dry etching, bottom over-etching will occur, which results in the T-shaped structures with bigger top and smaller bottom formed by the longitudinal sections of the second insulating layer 15 and the remaining photosensitive layer 14, as shown in FIG. 10.

Through the T-shaped structures formed as mentioned above, it is able to enable the first electrodes 2 to be fully separated from the adjacent filling block 6 by the slot 11, as shown in FIG. 11.

The method for manufacturing the touch panel in this embodiment further includes a step of forming the third insulating layer 16 which forms a top surface opposite to the base substrate 10 so as to provide insulation and protection effects, as shown FIG. 4.

During the actual application, it is desired to ensure the transmittance of each layer in the touch panel to be greater than 90%, alternatively greater than 95%, so as not to affect the normal image display.

The present disclosure may be applied to the touch display devices such as Add On, OGS, and On Cell.

The above are merely the alternative embodiments of the present disclosure. It should be appreciated that, a person skilled in the art may make further improvements and substitutions without departing from the principle of the present disclosure, and these improvements and substitutions shall also fall within the scope of the present disclosure.

What is claimed is:

1. A touch panel, comprising:
a base substrate;
an insulating, height difference structure arranged on the base substrate; and
a transparent conductive layer comprising first electrodes and filling blocks on the height difference structure and an array of second electrode components on the base substrate, wherein the filling blocks are arranged between the first electrodes and the array of second electrode components;
wherein the filling blocks comprise a first filling block adjacent to each first electrode and a second filling block adjacent to the array of second electrode components, and the first filling block is between the first electrode and the second filling block;
wherein the first filling block and the first electrode are staggered from each other in a height direction due to different heights relative to the base substrate, the second filling block and the array of second electrode components are staggered from each other in the height direction relative to the base substrate, and the first filling block and the second filling block are staggered from each other in the height direction relative to the base substrate, the first electrode is insulated from the first filling block, the array of second electrode components is insulated from the second filling block, and the first and the second filling blocks are insulated from each other,
wherein the array of second electrode components are connected serially by means of an array of conductive bridging lines so as to form several columns of second electrodes, and an extension direction of each second electrode is perpendicular to an extension direction of the first electrode.

2. The touch panel according to claim 1, wherein
the height difference structure includes a first insulating layer and a second insulating layer arranged above the first insulating layer, and the first insulating layer and the second insulating layer are each made of an inorganic insulating material;

the first insulation layer is provided with an array of windows, and a portion of the transparent conductive layer filling into the array of windows forms the array of second electrode components; and
the second insulating layer is arranged within a range of the first insulating layer and has an area less than an area of the first insulating layer, so as to expose a part of the first insulating layer.

3. The touch panel according to claim 2, wherein the second insulating layer is provided with a plurality of slots, and a portion of the transparent conductive layer filling into each of the slots forms the first filling blocks adjacent to the first electrode.

4. The touch panel according to claim 3, wherein the array of conductive bridging lines are arranged on the base substrate, the first insulating layer covers the array of conductive bridging lines, and two ends of the respective conductive bridging line are exposed through the array of windows; and
a connection line of the two exposed ends of the respective conductive bridging line is in a direction perpendicular to the extension direction of the first electrode, and the respective second electrode component is lapped onto a corresponding end of the conductive bridging line so that the array of second electrode components are connected serially to form several columns of second electrodes.

5. The touch panel according to claim 3, further comprising:
a photosensitive layer arranged between the second insulating layer and the transparent conductive layer, wherein sections of the second insulating layer and the photosensitive layer form a plurality of T-shaped structures with a bigger top portion and a smaller bottom portion.

6. The touch panel according to claim 3, further comprising:
a third insulating layer forming a top surface opposite to the base substrate.

7. The touch panel according to claim 3, wherein the first electrode is a sensing electrode, and the second electrode is a driving electrode.

8. The touch panel according to claim 2, wherein the array of conductive bridging lines are arranged on the base substrate, the first insulating layer covers the array of conductive bridging lines, and two ends of the respective conductive bridging line are exposed through the array of windows; and
a connection line of the two exposed ends of the respective conductive bridging line is in a direction perpendicular to the extension direction of the first electrode, and the respective second electrode component is lapped onto a corresponding end of the conductive bridging line so that the array of second electrode components are connected serially to form several columns of second electrodes.

9. The touch panel according to claim 2, further comprising:
a photosensitive layer arranged between the second insulating layer and the transparent conductive layer, wherein sections of the second insulating layer and the photosensitive layer form a plurality of T-shaped structures with a bigger top portion and a smaller bottom portion.

10. The touch panel according to claim 2, further comprising:

a third insulating layer forming a top surface opposite to the base substrate.

11. The touch panel according to claim 2, wherein the first electrode is a sensing electrode, and the second electrode is a driving electrode.

12. The touch panel according to claim 1, further comprising:
a third insulating layer forming a top surface opposite to the base substrate.

13. The touch panel according to claim 1, wherein the first electrode is a sensing electrode, and the second electrode is a driving electrode.

14. A method for manufacturing a touch panel, comprising:
preparing a base substrate;
forming an array of conductive bridging lines on the base substrate; a step of forming an insulating, height difference structure arranged on the base substrate and covering the array of conductive bridging lines, the height difference structure being provided with an array of windows, wherein two ends of the respective conductive bridging line are exposed through the array of windows; and
forming a transparent conductive layer comprising first electrodes and filling blocks on the height difference structure and an array of second electrode components within the array of windows, wherein the filling blocks are arranged between the first electrodes and the array of second electrode components;
wherein the filling blocks comprise a first filling block adjacent to each first electrode and a second filling block adjacent to the array of second electrode components, and the first filling block is between the first electrode and the second filling block;
wherein the first filling block and the first electrode are staggered from each other in a height direction due to different heights relative to the base substrate, the second filling block and the array of second electrode components are staggered from each other in the height direction relative to the base substrate, and the first filling block and the second filling block are staggered from each other in the height direction relative to the base substrate, the first electrode is insulated from the first filling block, the array of second electrode components is insulated from the second filling block, and the adjacent first and the second filling blocks are insulated from each other,
wherein a connection line of two exposed ends of the respective conductive bridging line is in a direction perpendicular to an extension direction of the first electrode, the respective second electrode component is lapped onto a corresponding end of the conductive bridging line so that the array of second electrode components is connected serially by means of the conductive bridging lines to form several columns of second electrodes, and an extension direction of each of the second electrodes is perpendicular to the extension direction of the first electrode.

15. The method according to claim 14, wherein the step of forming the height difference structure comprises:
a step of forming a first insulating layer, and forming the array of windows in the first insulating layer by an etching process; and
a step of forming a second insulating layer on the first insulating layer, and etching the second insulating layer by an etching process, so as to enable the second insulating layer to be arranged within a range of the first insulating layer and have an area less than an area of the first insulating layer, so as to expose a part of the first insulating layer,
wherein the first insulating layer and the second insulating layer are each made of an inorganic insulating layer.

16. The method according to claim 15, wherein
in the step of etching the second insulating layer, a plurality of slots are formed within the second insulating layer, and a portion of the transparent conductive layer falling within the slot forms the first filling blocks adjacent to the first electrode.

17. The method according to claim 16, wherein the step of etching the second insulating layer comprises:
coating a photosensitive layer onto the second insulating layer;
exposing and developing the photosensitive layer, so as to form a photosensitive-layer unreserved region and a photosensitive-layer reserved region; and
etching off a portion of the second insulating layer at the photosensitive-layer unreserved region by a dry etching method, so as to expose the first insulating layer, wherein sections of the second insulating layer and the photosensitive layer forming a plurality of T-shaped structures with a bigger top portion and a smaller bottom portion.

18. The method according to claim 15, wherein the step of etching the second insulating layer comprises:
coating a photosensitive layer onto the second insulating layer;
exposing and developing the photosensitive layer, so as to form a photosensitive-layer unreserved region and a photosensitive-layer reserved region; and
etching off a portion of the second insulating layer at the photosensitive-layer unreserved region by a dry etching method, so as to expose the first insulating layer, wherein sections of the second insulating layer and the photosensitive layer forming a plurality of T-shaped structures with a bigger top portion and a smaller bottom portion.

19. The method according to claim 15, further comprising:
a step of forming a third insulating layer, wherein the third insulating layer forms a top surface opposite to the base substrate.

20. The method according to claim 14, further comprising:
a step of forming a third insulating layer, wherein the third insulating layer forms a top surface opposite to the base substrate.

* * * * *